United States Patent
Tung et al.

(10) Patent No.: US 10,784,288 B2
(45) Date of Patent: Sep. 22, 2020

(54) DISPLAY PANEL HAVING A GRADING WIRING DESIGN

(71) Applicant: Au Optronics Corporation, Hsinchu (TW)

(72) Inventors: Che-Wei Tung, Taichung (TW); Wei-Li Lin, Hsinchu (TW); Keng-Chuan Cheng, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 64 days.

(21) Appl. No.: 16/192,827

(22) Filed: Nov. 16, 2018

(65) Prior Publication Data
US 2019/0393246 A1 Dec. 26, 2019

(30) Foreign Application Priority Data
Jun. 22, 2018 (TW) .............................. 107121592 A

(51) Int. Cl.
*H01L 27/12* (2006.01)
*H01L 23/52* (2006.01)
*H01L 23/528* (2006.01)
*H01L 25/18* (2006.01)

(52) U.S. Cl.
CPC ........ *H01L 27/124* (2013.01); *H01L 23/5283* (2013.01); *H01L 25/18* (2013.01)

(58) Field of Classification Search
CPC .... H01L 27/124; H01L 23/5283; H01L 25/18
USPC .................. 257/773; 438/618, 666
See application file for complete search history.

(56) References Cited

U.S. PATENT DOCUMENTS

| 7,026,648 B2 | 4/2006 | Lai |
| 9,070,334 B2 | 6/2015 | Chen et al. |
| 9,338,882 B2 | 5/2016 | Xiao et al. |
| 2010/0109993 A1* | 5/2010 | Chang ............... G02F 1/1345 345/92 |
| 2010/0149465 A1* | 6/2010 | Lin ................... G02F 1/133514 349/106 |
| 2012/0319623 A1* | 12/2012 | Cheng ............. G02F 1/13452 315/312 |
| 2015/0108480 A1* | 4/2015 | Xu ........................ H01L 22/22 257/59 |
| 2015/0333387 A1 | 11/2015 | Xiao et al. |

FOREIGN PATENT DOCUMENTS

CN 105101641 11/2015

* cited by examiner

*Primary Examiner* — Didarul A Mazumder
(74) *Attorney, Agent, or Firm* — JCIPRNET

(57) ABSTRACT

A display panel has a display region, an external circuit region located at an edge of the display panel, and a first and second wiring regions. The first wiring region is located between the second wiring region and the external circuit region. The display panel includes a pixel array, gate driving circuit groups disposed between the second wiring region and the display region, first signal line groups extended from the external circuit region to the first and second wiring region, and second signal line groups extended from the second wiring region and connected to the corresponding gate driving circuit groups. In the second wiring region, a first portion of the first signal line groups overlapped with the second signal line groups has a first width, and a second portion thereof not overlapped with the second signal line groups has a third width which is larger than the first width.

14 Claims, 4 Drawing Sheets

DISPLAY PANEL HAVING A GRADING WIRING DESIGN

CROSS-REFERENCE TO RELATED APPLICATION

This application claims the priority benefit of Taiwan application serial no. 107121592, filed on Jun. 22, 2018. The entirety of the above-mentioned patent application is hereby incorporated by reference herein and made a part of this specification.

BACKGROUND

Field of the Disclosure

The disclosure is related to a display panel, and particularly to a display panel having a grading wiring design.

Description of Related Art

In recent years, display panel having high resolution and large size has received more attention on the market. However, as the size of display panel increases, the length of signal line is increased; therefore, the width of signal line needs to be increased to reduce resistance thereof. Additionally, as the resolution of display panel is increased, under the restriction that the scan frequency cannot be reduced, the number of signal line needs to be increased as well, thereby avoiding that there is insufficient time for charging capacitance to cause reduction of image quality of display frame.

However, the increased width and number of signal line lead to increased cross-over capacitance between signal lines; as a result, the operation temperature of driving circuit rises and the overall output signal is delayed. Accordingly, it is an issue for practitioner of the field to solve how to effectively inhibit increase of cross-over capacitance without sacrificing the space for circuit layout.

SUMMARY OF THE DISCLOSURE

The disclosure provides a display panel, which capable of effectively inhibiting increase of cross-over capacitance.

An embodiment of the disclosure provides a display panel having a display region, a first wiring region, a second wiring region and an external circuit region. The external circuit region is disposed at an edge of the display panel, and the first wiring region is located between the external circuit region and the second wiring region. The display panel includes a pixel array, a plurality of gate driving circuit groups, a plurality of first signal line groups and a plurality of second signal line groups. The pixel array is disposed in the display region. The gate driving circuit groups are disposed between the second wiring region and the display region, and the gate driving circuit groups are electrically connected to the pixel array. The first signal line groups are extended from the external circuit region to the first wiring region and the second wiring region. The second signal line groups are extended from the second circuit region and connected to the corresponding gate driving circuit groups. The second signal line groups are respectively connected to the corresponding first signal line groups, and the second signal line groups are partially overlapped with the first signal line groups. In the second wiring region, a first portion of the first signal line groups overlapped with the second signal line groups has a first width, and a second portion of the first signal line groups not overlapped with the second signal line groups has a third width, wherein the third width is larger than the first width.

Another embodiment of the disclosure provides a display panel having a display region, a first wiring region, a second wiring region and an external circuit region. The external circuit region is disposed at an edge of the display panel, and the first wiring region is disposed between the external circuit region and the second wiring region. The display panel includes a pixel array, a plurality of gate driving circuit groups, a plurality of first signal line groups and a plurality of second signal line groups. The pixel array is disposed in the display region. The gate driving circuit groups are disposed between the second wiring region and the display region, and the gate driving circuit groups are electrically connected to the pixel array. The first signal line groups are extended from the external circuit region to the first wiring region and the second wiring region. The second signal line groups are extended from the second wiring region and connected to the corresponding gate driving circuit groups. The second signal line groups are respectively connected to the corresponding first signal line groups, and the second signal line groups are partially overlapped with the first signal line groups. A first portion of the first signal line groups overlapped with the second signal line groups has a first width, the first signal line groups have a second width in the first wiring region, and the first widths between the first signal line groups at different positions of the panel may be different from each other.

Based on the above, in the display panel described in the embodiments of the disclosure, for the second wiring region, the first portion of the first signal line groups overlapped with the second signal line groups has a first width, and the second portion of the first signal line groups not overlapped with the second signal line groups has a third width larger than the first width. In this manner, the increase of cross-over capacitance between the first signal line groups and the second signal line groups can be effectively inhibited, such that the gate driving circuit has good output performance.

In order to make the aforementioned features and advantages of the disclosure more comprehensible, embodiments accompanying figures are described in detail below.

DESCRIPTION OF EMBODIMENTS

Figure 1:
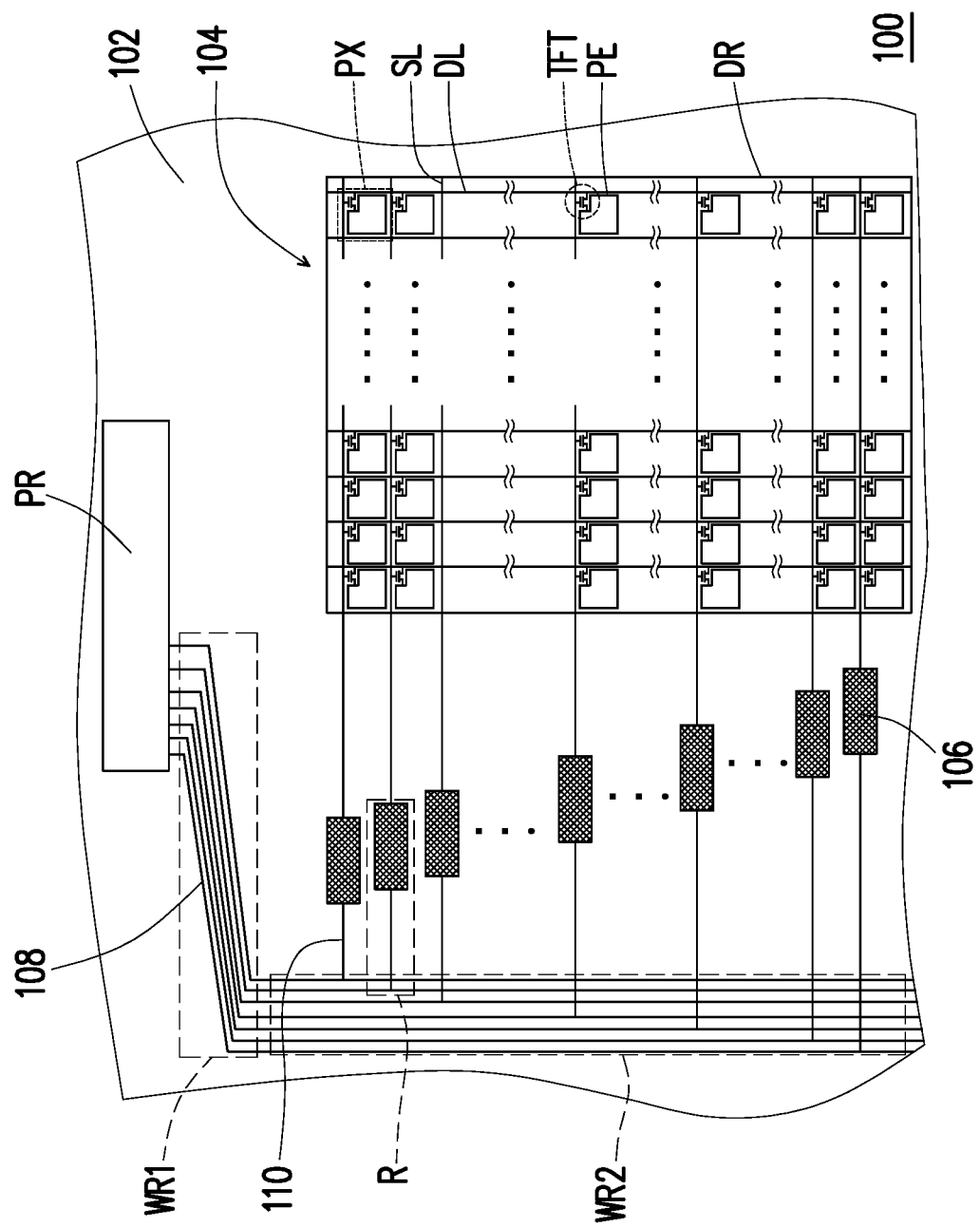
FIG. 1 is a schematic top view of a display panel according to an embodiment of the disclosure.

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Additionally, directional terminology, such as "top," "bottom," "left," "right," "front," or "back," etc., is used with reference to the orientation of the Figure(s) being described. As such, the directional terminology is used for purposes of illustration and is in no way limiting.

Figure 2B:
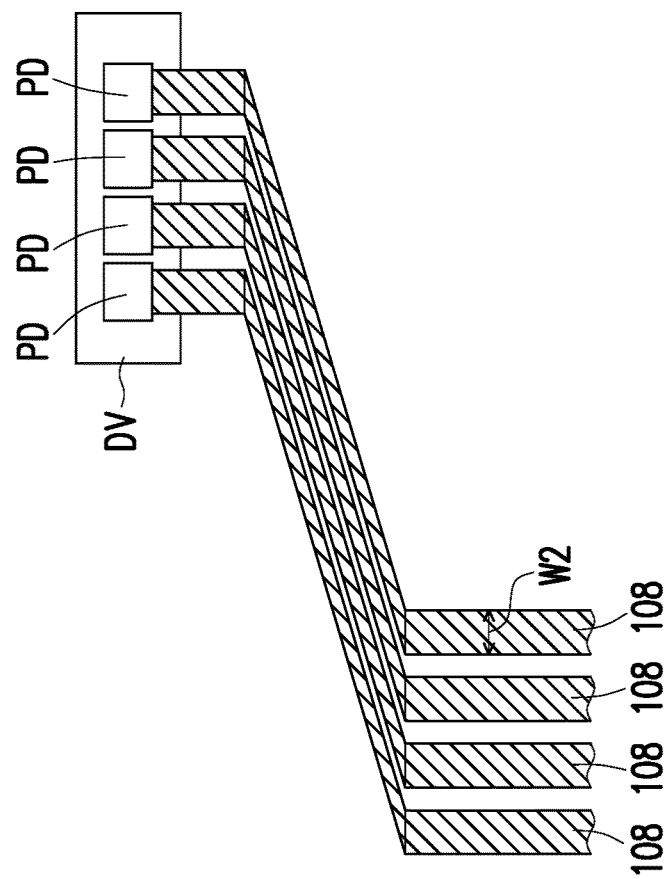
FIG. 2B is an enlargement view of a region encircled by dashed line WR1 in FIG. 1.
Figure 2A:
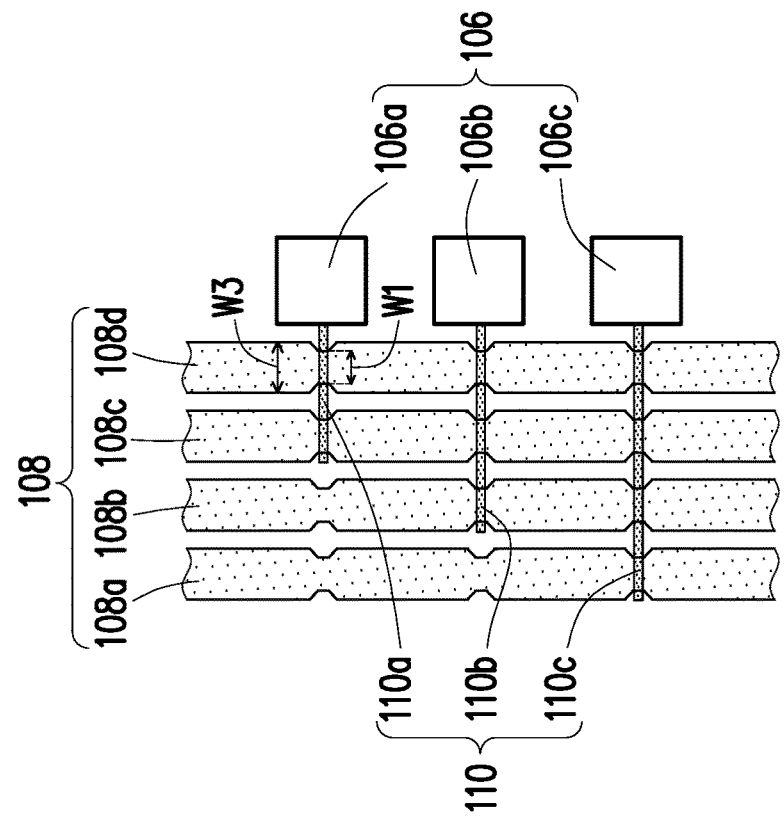
FIG. 2A is an enlargement view of a region encircled by dashed line R in FIG.
Figure 3:
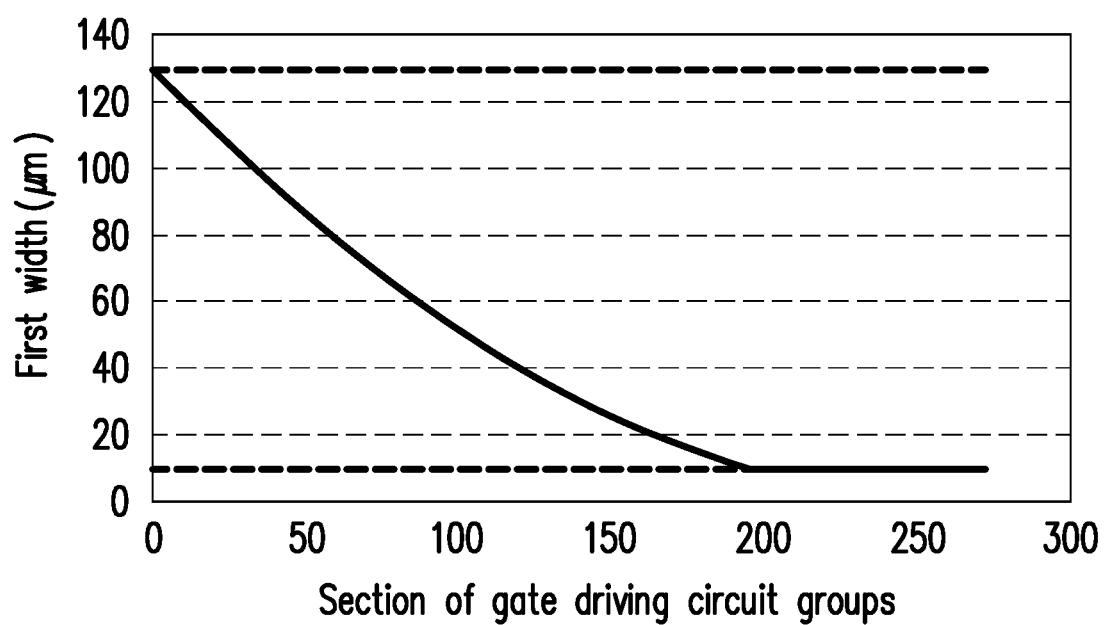
FIG. 3 is a curve diagram showing change of first width along with change of sections of gate driving circuit groups.

FIG. 1 is a schematic top view of a display panel according to an embodiment of the disclosure. FIG. 2A is an enlargement view of a region encircled by dashed line R in FIG. 1. FIG. 2B is an enlargement view of a region encircled by dashed line WR1 in FIG. 1. FIG. 3 is a curve diagram showing change of first width along with change of sections of gate driving circuit groups.

Referring to FIG. 1, a display panel 100 has a display region DR, a first wiring region WR1, a second wiring region WR2, and an external circuit region PR. The external circuit region PR may be disposed at an edge of the display panel 100, and the external circuit region PR may have a contact point or a driving element. In the embodiment, the driving element in the external circuit region PR may be disposed on the front surface (e.g., the surface facing viewers) of a substrate 102 through a surface mount technique (SMT), but not limited thereto. In other embodiments, the driving element in the external circuit region PR may be disposed on the rear surface (e.g., the surface facing away from viewers) of the substrate 102 through a flexible printed circuit (FPC). In the embodiment, the first wiring region WR1 is disposed between the external circuit region PR and the second wiring region WR2. That is, in terms of relative position, the first wiring region WR1 is closer to the external circuit region PR and the second wiring region WR2 is farther from the external circuit region PR. In some embodiments, the signal line (e.g., HC signal line) in the first wiring region WR1 may be cascaded to the driving element in the external circuit region PR in the manner of wire on array (WOA); that is, the first wiring region WR1 may be referred to as WOA region.

The display panel 100 may include a pixel array 104, a plurality of gate driving circuit groups 106, a plurality of first signal line groups 108, and a plurality of second signal line groups 110. In some embodiments, the pixel array 104, the plurality of gate driving circuit groups 106, the plurality of first signal line groups 108, and the plurality of second signal line groups 110 may be respectively disposed on the substrate 102. The material of the substrate 102 may be a glass base material, a quartz base material, or an organic polymer base material, the disclosure is not limited thereto.

The pixel array 104 is disposed in the display region DR. The pixel array 104 includes a plurality of sub-pixels PX arranged in arrays, a plurality of scan lines SL and a plurality of data lines DL. In the embodiment, the sub-pixels PX may be electrically connected to the corresponding scan lines SL and data lines DL, and the scan lines SL and the data lines DL may be interlaced with each other. In some embodiments, the sub-pixels PX may include an active element TFT and a pixel electrode PE, wherein the active element TFT may be electrically connected to the pixel electrode PE. The active element TFT may include a gate, a source and a drain. In the embodiment, the gate of the active element TFT may be electrically connected to the corresponding scan line. The source of the active element TFT may be electrically connected to the corresponding data line DL. The drain of the active element TFT may be electrically connected to the corresponding pixel electrode PE. In some embodiments, the gate of the active element TFT and the scan line SL may be formed through the same patterned conductive layer, and the scan line SL and the data line DL may belong to different patterned conductive layer. The active element TFT may be a bottom-gate transistor, a top-gate transistor, a stereography transistor, or other suitable transistors. In some embodiments, the pixel electrode PE may selectively include a plurality of slits (not show) having different extending directions, or a plurality of slits having substantially identical extending direction, the disclosure is not limited thereto.

The gate driving circuit groups 106 are disposed between the second wiring region WR2 and the display region DR, and the gate driving circuit groups 106 are electrically connected to the pixel array 104. For example, the gate driving circuit groups 106 are electrically connected to the corresponding scan lines SL, and electrically connected to the gate in the active element TFT. In the embodiment, the gate driving circuit groups 106 may be arranged along the extending direction of the data lines DL. In some embodiments, each of the gate driving circuit groups 106 may include a plurality of gate driving circuits 106a-106c. In some embodiments, in the formation of the active element TFT in the pixel array 104, the active elements of the gate driving circuits 106a-106c in the second wiring region WR2 are formed as well, thereby replacing the gate driver IC which takes a large area, and thus reducing the frame width of the display panel 100. It should be indicated that the gate driving circuit groups 106 in FIG. 2A are exemplified by including three gate driving circuits 106a-106c, the disclosure is not limited thereto. The number of the gate driving circuit in each of the gate driving circuit groups 106 may be adjusted as appropriate depending on the design. Additionally, the number of the gate driving circuit groups 106 may be adjusted as appropriate depending on the size or resolution of the display panel 100.

The first signal line groups 108 are extended from the external circuit region PR to the first wiring region WR1 and the second wiring region WR2. In some embodiments, the extending direction of the first signal line groups 108 disposed in the first wiring region WR1 may be different from the extending direction of the first signal line groups 108 disposed in the second wiring region WR2 (as shown in FIG. 1). In some embodiments, the first signal line groups 108 may include an initial signal line, a high-frequency signal line, a low-frequency signal line, a low-level signal line, a constant voltage signal line, or a combination thereof. In some embodiments, the temperature of the first signal line groups 108 in the first wiring region WR1 may be lower than 45° C., thereby avoiding that the temperature of the display panel 100 is too high to cause safety problem. In some embodiments, the first signal line groups 108 may be electrically connected to the driving element disposed in the external circuit region PR. In the embodiment, each of the first signal line groups 108 may include a plurality of first signal lines 108a-108d. It should be indicated that the first signal line groups 108 in FIG. 2A are exemplified by including four first signal lines 108a-108d, the disclosure is not limited thereto. The number of the first signal lines in each of first signal line groups 108 may be adjusted as appropriate depending on the design. Additionally, the number of the first signal line groups 108 may be adjusted as appropriate depending on the size or resolution of the display panel 100. In the embodiment, the first signal line groups 108 may be respectively electrically connected to the corresponding driving element DV in the external circuit region PR, for example, the first signal line groups 108 are respectively connected to the driving element DV through the corresponding pad PD (as shown in FIG. 2B).

The second signal line groups 110 are extended from the second wiring region WR2 and connected to the corresponding gate driving circuit groups 106, wherein the second signal line groups 110 are respectively connected to the corresponding first signal line groups 108, and the second signal line groups 110 are partially overlapped with the first signal line groups 108. In the embodiment, the second signal line groups 110 may be overlapped with the first signal line groups 108 disposed in the second wiring region WR2, and the first signal line groups 108 disposed in the first wiring region WR1 may not be overlapped with the second signal line groups 110. In some embodiments, the second signal line groups 110 and the first signal line groups 108 may be partially interlaced, and the second signal line groups 110 and the first signal line groups 108 may disposed at different layers. In the embodiment, each of the second signal line groups 110 may include a plurality of second signal lines 110a-110c. It should be pointed out that the second signal line groups 110 in FIG. 2A are exemplified by including three second signal lines 110a-110c, the disclosure is not limited thereto. The number of the second signal lines in each of the second signal line groups 110 may be adjusted as appropriate depending on the design. Additionally, the number of the second signal line groups 110 may be adjusted as appropriate depending on the size or resolution of the display panel 100.

Referring to FIG. 1, FIG. 2A and FIG. 2B, in the second wiring region WR2, a first portion of the first signal line groups 108 overlapped with the second signal line groups 110 has a first width W1, and a second portion of the first signal line groups 108 not overlapped with the second signal line groups 110 has a third width W3 larger than the first width W1. In this manner, the increase of cross-over capacitance between the first signal line groups 108 and the second signal line groups 110 can be effectively inhibited, such that the gate driving circuit has good output performance.

In some embodiments, a current of the first portion of the first signal line groups 108 is $I_A$, and the first signal line groups 108 has a second width W2 in the first wiring region WR1, and the current of the first signal line groups 108 in the first wiring region WR1 is $I_B$, wherein the ratio of the first width W1 to the second width W2 may be approximately equal to $I_A^2/I_B^2$. In this manner, the first signal line groups 108 overlapped with the second signal line groups 110 and the first signal line groups 108 disposed in the first wiring region WR1 have the same current density (ratio of current squared to width), thereby avoiding that the temperature of the portion where the first signal line groups 108 overlapped with the second signal line groups 110 exceeds the temperature of the first signal line groups 108 disposed in the first wiring region WR1.

Figure 2C:
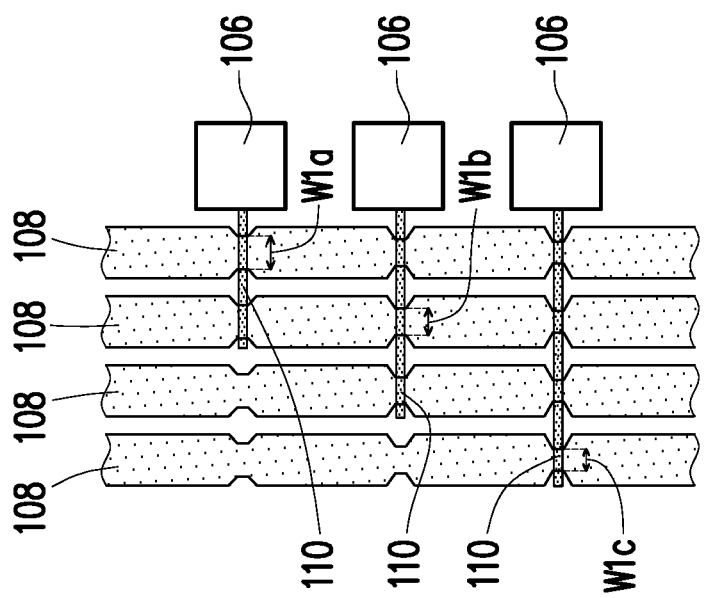
FIG. 2C is a schematic view showing change of a first width of first signal line groups along with change of sections of gate driving circuit groups.

Additionally, since the resistive-capacitive (RC) of the signal line is distributed uniformly, the current of the first signal line groups 108 gradually becomes smaller and smaller as getting farther away from the signal source (e.g., the driving element in the external circuit region PR). Accordingly, in the condition where the ratio of the first width W1 to the second width W2 is approximately equal to $I_A^2/I_B^2$, the first widths W1 between each of the first signal line groups 108 may be different from each other. As shown in FIG. 2C and FIG. 3, first widths W1a, W1b and W1c may become smaller and smaller (W1c<W1b<W1a) as getting farther away from the signal source. In this manner, the overlapping area of the first signal line groups 108 and the second signal line groups 110 may become smaller and smaller as getting farther away from the signal source, such that the increase of the cross-over capacitance between the first signal line groups 108 and the second signal line groups 110 can be inhibited effectively.

Based on the above, the display panel 100 can significantly improve the capacitance load of the overall signal line without sacrificing any space for wiring layout or without changing the circuit design, such that not only the gate driving circuit has good output performance but also the operation temperature can be reduced.

In the embodiment, the magnitude of the current of the first signal line groups 108 in the second wiring region WR2 is associated with the section of gate driving circuit groups 106. For example, the display panel 100 may include 270 sections of gate driving circuit groups 106, each sections of the gate driving circuit groups 106 includes a plurality of gate driving circuits (e.g., gate driving circuits 106a-106c), wherein one of the gate driving circuit groups 106 that is the closest to the external circuit region PR is the $270^{th}$ section of the gate driving circuit groups 106. The current of the first signal line groups 108 for connecting the $270^{th}$ section of the gate driving circuit groups 106 is approximately equal to the current of the first signal line groups 108 in the first wiring region WR1 (270/270); the current of the first signal line groups 108 for connecting the $260^{th}$ section of the gate driving circuit groups 106 is approximately equal to 99.3% (260/270) of the current of the first signal line groups 108 in the first wiring region WR1. In other words, the corresponding first width W1 may be calculated according to the sections of the gate driving circuit groups 106 and the width (i.e., second width W2) of the first signal line groups 108 in the first wiring region WR1.

In the embodiment, the first width W1 of one of the first signal line groups 108 adjacent to the external circuit region PR may be larger than the first width W1 of another one of the first signal line groups 108 away from the external circuit region PR. In other words, the first width W1 of the first signal line groups 108 may be gradually decreased as getting farther away from the external circuit region PR (as shown in FIG. 2C and FIG. 3). Moreover, each of the first signal line groups 108 may include a plurality of first signal lines 108a-108d, wherein the widths of the portions where the first signal line groups 108a-108d are overlapped with the second signal line groups 110 are the same. In other words, the first widths W1 between each of the first signal line groups 108 may be different, but the first widths W1 of the first signal lines 108a-108d among each of the first signal line groups 108 may be the same, the disclosure is not limited thereto. In other embodiments, the first widths W1 between each of the first signal line groups 108 may be different, and the first widths W1 of the first signal lines 108a-108d among each of the first signal line groups 108 may be designed to be different according to the current density.

In some embodiments, a second portion of the first signal line groups 108 not overlapped with the second signal line groups 110 has the third width W3, and the third width W3 is approximately equal to the second width W2, such that the first signal line groups 108 have good impedance match, thereby improving the quality of signal transmission. In the embodiment, the third width W3 may be larger than or equal to the first width W1. For example, the display panel 100 may include 270 sections of gate driving circuit groups 106. Under the condition where the current of the first signal line groups 108 for connecting the $270^{th}$ section of the gate driving circuit groups 106 is approximately equal to the current of the first signal line groups 108 in the first wiring region WR1 (270/270), the third width W3 may be approximately equal to the first width W1. Moreover, under the condition where the current of the first signal line groups 108 for connecting the $260^{th}$ section of the gate driving circuit groups 106 is approximately equal to 99.3% (260/270) of the first signal line groups 108 in the first wiring region WR1, the third width W3 may be larger than the first width W1.

In some embodiments, the contours of the first signal line groups 108 may be selectively identical from each other, such that the first signal line groups 108 has good impedance match, thereby improving the quality of signal transmission. For example, the number of times that the first signal line groups 108 are crossed over by the second signal line groups 110 is different when being electrically connected to different section of the gate driving circuit groups 106. As shown in FIG. 1, the first signal line groups 108 that are electrically connected to the gate driving circuit groups 106 (e.g., gate driving circuit groups 106 closer to the external circuit region PR) having larger section are crossed over more times by the second signal line groups 110, and thus there more portions in the first signal line groups 108 with reduced width; as a result, the contours of each of the first signal line groups 108 are different. However, in order for the first signal line groups 108 to have good impedance match, the first signal line groups 108 may have identical contours selectively.

In some embodiments, as shown in FIG. 3, the first width W1 maintains at the minimum value after being reduced to the minimum value. For example, the first width W1 of the first signal line group 108 configured for connecting the 200$^{th}$ section of the gate driving circuit group 106 reaches the minimum value; therefore, for the first signal line group 108 configured for connecting the 201$^{th}$ section of the gate driving circuit group 106, the first width W1 thereof maintains at the minimum value and is no longer reduced. In the embodiment, the minimum value is exemplified as 10 μm, the disclosure is not limited thereto. In other embodiments, the minimum value may be adjusted as appropriate depending on the limit of the manufacturing machine.

Experiment Example 1 and Comparative Example 1 are provided below to more specifically describe the features of the disclosure. Although the following Experiment Example is provided, in the condition where the scope of the disclosure is not changed, the signal line, material, size, test method and test parameters may be modified as appropriate. Therefore, the following embodiment does not serve to limit the disclosure.

Experiment Example 1

Information regarding display panel of Experiment Example 1 is as follows.

Width ($T_{21}$ width) of active element in gate driving circuit: 21041 μm

Second width ($W_{WO4}$): 130 μm

First width ($W_{bus\_X\_over}$): 130 μm to 10 μm (as shown in FIG. 3)

Comparative Example 1

Information regarding display panel in Comparative Example 1 is as follows.

Width ($T_{21}$ width) of active element in gate driving circuit: 21041 μm

Second width ($W_{WO4}$): 130 μm

First width ($W_{bus\_X\_over}$): 130 μm

Test of Response Time

The response time of HC signal line in Experiment Example 1 and Comparative Example 1 is tested respectively and summarized in Table 1 below. The response time is, for example, obtained through the test method below, but not limited thereto. The test of response time was performed by using a luminance meter, Model LCD5100 made by Otsuka Electronics Co., Ltd. The light source was a halogen lamp. The low-pass filter was set to be 5 kHz. The sample was placed into a TN device in a normally white mode with a distance (cell gap) of 5.0 μm between two glass substrates and a twist angle of 80 degrees. A rectangular wave (60 Hz, 5 V, 0.5 second) was applied to the device. On this occasion, the device was irradiated with light in the vertical direction, and the amount of light passing through the device was measured. The transmittance was regarded as 100% when the amount of light became the maximum and the transmittance was regarded as 0% when the amount of light became the minimum. Rise time was the time required for a change in transmittance from 10% to 90%. Fall time was the time required for a change in transmittance from 90% to 10%. The response time was the sum of the rise time and the fall time thus obtained.

Test of Cross-Over Capacitance

Test of cross-over capacitance between HC signal lines of Experiment Example 1 and Comparative Example 1 is described below, and experiment result is summarized in Table 1 as follows.

TABLE 1

|  | Experiment Example 1 | Comparative Example 1 |
|---|---|---|
| $T_{21}$ width (μm) | 21041 | 21041 |
| $W_{WO4}$ (μm) | 130 | 130 |
| $W_{bus\ X\ Over}$ (μm) | 130 to 10 | 130 |
| HC cross-over capacitance (pF) | 499 | 1235 |
| HC rise time (μs) | 0.68 | 0.9 |
| HC fall time (μs) | 0.68 | 0.91 |
| HC response time (μs) | 1.36 | 1.81 |

Table 1 shows that, as compared with Comparative Example 1, the Experiment Example 1 having grading line width has better response time and smaller cross-over capacitance.

In summary, in the display panel described in the embodiments of the disclosure, for the second wiring region, the first portion of the first signal line groups overlapped with the second signal line groups has the first width, and the second portion of the first signal line groups not overlapped with the second signal line groups has a third width larger than the first width. In this manner, the increase of cross-over capacitance between the first signal line groups and the second signal line groups can be effectively inhibited, such that the gate driving circuit has good output performance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel having a display region, a first wiring region, a second wiring region and an external circuit region, wherein the external circuit region located at an edge of the display panel, and the first wiring region disposed between the external circuit region and the second wiring region, the display panel comprising:
   a pixel array disposed in the display region;
   a plurality of gate driving circuit groups, disposed between the second wiring region and the display region, and the plurality of gate driving circuit groups electrically connected to the pixel array;

a plurality of first signal line groups extended from the external circuit region to the first wiring region and the second wiring region; and a plurality of second signal line groups extended from the second wiring region and connected to the corresponding plurality of gate driving circuit groups, wherein the plurality of second signal line groups respectively connected to the corresponding plurality of first signal line groups, and the plurality of second signal line groups partially overlapped with the plurality of first signal line groups, wherein in the second wiring region, a first portion of the plurality of first signal line groups overlapped with the plurality of second signal line groups has a first width and a second portion of the plurality of first signal line groups not overlapped with the plurality of second signal line groups has a third width, wherein the third width is larger than the first width.

2. The display panel according to claim 1, wherein a current of the first portion of the plurality of first signal line groups is $I_A$, and the plurality of first signal line groups has a second width in the first wiring region, and a current of the plurality of first signal line groups in the first wiring region is $I_B$, a ratio of the first width and the second width is approximately equal to $I_A^2/I_B^2$.

3. The display panel according to claim 2, wherein the third width is approximately equal to the second width.

4. The display panel according to claim 1, wherein the first width between each of the plurality of first signal line groups are different from each other.

5. The display panel according to claim 4, wherein the first width of one of the plurality of first signal line groups adjacent to the external circuit region is larger than the first width of another one of the plurality of first signal line groups away from the external circuit region.

6. The display panel according to claim 1, wherein each of the plurality of first signal line groups comprises a plurality of first signal lines, wherein widths of the plurality of first portion of the first signal lines overlapped with the plurality of second signal line groups are the same.

7. The display panel according to claim 1, wherein the plurality of first signal line groups comprise an initial signal line, a high-frequency signal line, a low-frequency signal line, a low-level signal line, or a constant voltage signal line.

8. A display panel having a display region, a first wiring region, a second wiring region and an external circuit region, wherein the external circuit region located at an edge of the display panel, and the first wiring region located between the external circuit region and the second wiring region, the display panel comprising:

a pixel array disposed in the display region;

a plurality of gate driving circuit groups disposed between the second wiring region and the display region, wherein the plurality of gate driving circuit groups electrically connected to the pixel array;

a plurality of first signal line groups extended from the external circuit region to the first wiring region and the second wiring region; and a plurality of second signal line groups extended from the second wiring region and connected to the corresponding plurality of gate driving circuit groups, wherein the second signal line groups respectively connected to the corresponding plurality of first signal line groups and the second signal line groups partially overlapped with the plurality of first signal line groups, wherein a first portion of the plurality of first signal line groups overlapped with the plurality of second signal line groups has a first width, and the plurality of first signal line groups have a second width in the first wiring region, and the first width between each of the plurality of first signal line groups are different from each other.

9. The display panel according to claim 8, wherein a current of the first portion of the plurality of first signal line groups overlapped with the plurality of second signal line groups is $I_A$, a current of the plurality of first signal line groups in the first wiring region is $I_B$, and a ratio of the first width to the second width is approximately equal to $I_A^2/I_B^2$.

10. The display panel according to claim 8, wherein in the second wiring region, a second portion of the plurality of first signal line groups not overlapped with the plurality of second signal line groups has a third width, and the third width is approximately equal to the second width.

11. The display panel according to claim 10, wherein the third width is larger than the first width.

12. The display panel according to claim 8, wherein the first width of one of the plurality of first signal line groups adjacent to the external circuit region is larger than the first width of another one of the plurality of first signal line groups away from the external circuit region.

13. The display panel according to claim 8, wherein each of the plurality of first signal line groups comprises a plurality of first signal lines, wherein widths of the first portion of the plurality of first signal lines overlapped with the plurality of second signal line groups are the same.

14. The display panel according to claim 8, wherein the plurality of first signal line groups comprise an initial signal line, a high-frequency signal line, a low-frequency signal line, a low-level signal line, or a constant voltage signal line.

* * * * *